United States Patent
Litwin et al.

(10) Patent No.: US 7,227,730 B2
(45) Date of Patent: Jun. 5, 2007

(54) DEVICE FOR ESD PROTECTION OF AN INTEGRATED CIRCUIT

(75) Inventors: Andrej Litwin, Danderyd (SE); Ola Pettersson, Jaerfaella (SE)

(73) Assignee: Infineon Technolgoies AG, Munich (DE)

( * ) Notice: Subject to any disclaimer, the term of this patent is extended or adjusted under 35 U.S.C. 154(b) by 0 days.

(21) Appl. No.: 11/141,986

(22) Filed: May 31, 2005

(65) Prior Publication Data

US 2006/0018066 A1    Jan. 26, 2006

(30) Foreign Application Priority Data

May 28, 2004    (EP)    ................... 04012772

(51) Int. Cl.
| | |
|---|---|
| H02H 9/00 | (2006.01) |
| H02H 3/22 | (2006.01) |
| H02H 1/00 | (2006.01) |
| H02H 1/04 | (2006.01) |
| H02H 9/06 | (2006.01) |
| H01C 7/12 | (2006.01) |

(52) U.S. Cl. .................... 361/56; 361/111; 361/118
(58) Field of Classification Search ............. 361/56, 361/111, 118
See application file for complete search history.

(56) References Cited

U.S. PATENT DOCUMENTS

| | | |
|---|---|---|
| 4,710,791 A | 12/1987 | Shirato et al. |
| 4,730,208 A | 3/1988 | Sugino et al. |
| 4,806,999 A | 2/1989 | Strauss |
| 4,876,584 A | 10/1989 | Taylor |
| 5,196,913 A | 3/1993 | Kim et al. |
| 5,615,073 A | 3/1997 | Fried et al. |
| 5,808,343 A | 9/1998 | Pilling et al. |
| 6,331,726 B1 * | 12/2001 | Voldman ..................... 257/541 |
| 6,852,036 B2 * | 2/2005 | Cermak et al. ............. 464/173 |
| 2001/0032733 A1 | 10/2001 | Yamaguchi et al. |
| 2002/0003227 A1 | 1/2002 | Kageyama et al. |
| 2002/0010247 A1 | 1/2002 | Sakurai et al. |
| 2004/0021178 A1 | 2/2004 | Larson |
| 2005/0041347 A1 * | 2/2005 | Khorram ...................... 361/56 |

FOREIGN PATENT DOCUMENTS

EP    0 371 663 B1    6/1994

(Continued)

OTHER PUBLICATIONS

Victory et al., "A Four-Terminal Compact Model for High Voltage Diffused Resistors with Field Plates", IEEE Journal of Solid-State Circuits, vol. 33, No. 9, Sep. 1998, pp. 1453-1458, (6 pages).

*Primary Examiner*—Stephen W. Jackson
*Assistant Examiner*—Dharti H. Patel
(74) *Attorney, Agent, or Firm*—Maginot, Moore & Beck

(57) ABSTRACT

A device for ESD (electrostatic discharge) protection of a circuit of a semiconductor device comprises a field effect transistor based varistor with gate, source and drain regions, wherein one of the source and drain regions is connected to an input/output pad of the semiconductor device, and the other one of the source and drain regions is connected to an input/output terminal of the circuit. A biasing circuit is connected to the gate region of the varistor to create an accumulation region below the gate of the varistor at normal operating voltages of said semiconductor device. The semiconductor device is preferably an integrated device on a single substrate.

20 Claims, 3 Drawing Sheets

FOREIGN PATENT DOCUMENTS

| | | |
|---|---|---|
| JP | 2001032733 | 2/2001 |
| JP | 2001144208 | 5/2001 |
| JP | 2001202830 | 7/2001 |
| JP | 2001210939 | 8/2001 |
| JP | 2001230510 | 8/2001 |
| JP | 2001284400 | 10/2001 |
| JP | 2001293686 | 10/2001 |
| JP | 2001307555 | 11/2001 |
| JP | 2001332137 | 11/2001 |
| JP | 2001337340 | 12/2001 |
| JP | 2001351944 | 12/2001 |
| JP | 2002 003227 | 1/2002 |
| JP | 2002010247 | 1/2002 |
| JP | 2002043363 | 2/2002 |
| JP | 2002075580 | 3/2002 |
| WO | WO 03/021737 A1 | 3/2003 |
| WO | WO 03/063198 A2 | 7/2003 |

\* cited by examiner

DEVICE FOR ESD PROTECTION OF AN INTEGRATED CIRCUIT

CROSS-REFERENCE TO RELATED APPLICATION

This application claims priority from European Patent Application No. 04012772.2, which was filed on May 28, 2004, and is incorporated herein by reference in its entirety.

BACKGROUND OF THE INVENTION

1. Field of the Invention

The present invention generally relates to the field of integrated circuit technology, and more specifically the invention relates to a monolithically integrated device for ESD (electrostatic discharge) protection of an integrated circuit.

2. Description of Prior Art

Integrated electrostatic discharges may damage electronic devices, particularly electronic semiconductor devices fabricated on insulating or semi-insulating substrates, such as integrated circuits. Devices for protecting against ESD are conventionally incorporated in the input/output paths of most semiconductor devices in order to shunt excessive charge away from the sensitive circuits of the semiconductor devices.

Semiconductor devices are often provided with some protection against high input currents, such as e.g. electrical resistors connected in their input paths, thereby limiting the input current. These resistors are conventionally located outside the bonding pads of the semiconductor devices, thereby occupying valuable chip area.

In U.S. Pat. No. 4,806,999 an integrated circuit is disclosed, which has an input pad protected from electrostatic discharge by two diodes located under the periphery of the pad. One of the diodes is typically formed in an n-tub, and the other in a p-tub. In one embodiment the boundary between the tubs is located in a region not overlaid by the exposed portion of the pad. An input resistor is optionally included between the pad and the input circuitry for additional ESD protection.

In U.S. Pat. No. 4,876,584 an integrated circuit is disclosed, which has a terminal pad protected by a diode directly connected between the pad and a power supply, a transistor directly connected to another power supply, and a resistive path connecting the pad to the remainder of the integrated circuit.

A similar ESD protection structure is disclosed in EP 0 371 663 A1, where the resistor is formed as a metal silicide link located horizontally outside the pad.

Other ESD protection structures including a resistor in an input and/or output path are disclosed in U.S. Pat. Nos. 5,808,343, 5,615,073, 5,196,913, 4,730,208 and 4,710,791.

For high frequency applications at gigahertz frequencies, however, the mentioned resistor creates several problems. The RC product of the circuit input capacitance and the ESD resistor set the limit of the highest operation frequency. Furthermore, the resistance itself creates noise, which is deleterious in low noise applications. It would be highly advantageous for high frequency circuits if the resistor could assume a low value during normal operation and high value during the ESD protection.

A solution to this problem is to provide a varistor in the ESD protection circuit, see WO03/021737. The varistor has a low resistance value while operating in the voltage regime normal for the circuit function and a high resistance value while subject to the voltage exceeding this normal voltage, e.g. during an ESD event. Diodes are connected as current shunting devices. Another similar varistor-based ESD protection circuit is disclosed in U.S. Pat. No. 6,331,726 B1.

While a prior art varistor solution as disclosed in WO03/021737 may provide an increase in the resistance of the varistor of four times when the voltage is increased from 0.5 to 7 V, and may have a capacitance as low as 70 fF, thereby fulfilling high frequency circuit requirements, the series resistance at normal operating voltages may be too high. Calculations have indicated a series resistance of 28 ohm, which may be considered too high for some applications.

One manner to reduce the series resistance is to increase the size of the varistor, but then the parasitic capacitance will increase in turn, which is deleterious for high frequency circuits.

SUMMARY OF THE INVENTION

Accordingly, it is an object of the present invention to provide a device for ESD protection of a circuit of a semiconductor device, which overcomes the problems and limitations associated with the prior art devices.

It is in this respect a particular object of the invention to provide such a device, which is small, which has a very low series resistance at normal operating voltages of the semiconductor device, and which adds a very low parasitic capacitance to the circuit, thereby not essentially affecting the speed of the circuit.

It is a further particular object of the invention to provide such a device, which is capable of protecting a high or radio frequency integrated circuit against excessive positive and negative voltages.

It is still a further object of the invention to provide such a device, which uses components feasible in standard bulk or SOI CMOS technology, so that the device can be fabricated in a standard CMOS process without the need of additional processing steps.

In accordance with a first aspect, the invention provides a device for ESD (electrostatic discharge) protection of a circuit of a semiconductor device having a field effect transistor based varistor with gate, source and drain regions, wherein a first one of said source and drain regions is connected to an input/output pad of said semiconductor device, and the second one of said source and drain regions is connected to an input/output terminal of said circuit, wherein said device for ESD protection has a biasing circuit which is connected to the gate region of said field effect transistor based varistor to create an accumulation region below the gate region of the field effect transistor based varistor at normal operating voltages of said semiconductor device.

In accordance with a second aspect, the invention provides a method for reducing the resistance of a device for ESD (electrostatic discharge) protection of a circuit of a semiconductor device having a field effect transistor based varistor with gate, source and drain regions, wherein a first one of said source and drain regions is connected to an input/output pad of said semiconductor device, and the second one of said source and drain regions is connected to an input/output terminal of said circuit, the method including the step of:

biasing the gate region of said field effect transistor based varistor to create an accumulation region below the gate region of the field effect transistor based varistor at normal operating voltages of said semiconductor device to thereby reduce the series resistance between the input/output pad of said semiconductor device and the input/output terminal of said circuit.

The present invention provides a device for ESD protection of a circuit of a semiconductor device comprising a field effect, preferably MOS, transistor based varistor with gate, source and drain regions, wherein one of the source and drain regions is connected to an input/output pad of the semiconductor device, and the other one of said source and drain regions is connected to an input/output terminal of the circuit. The device for ESD protection comprises a biasing circuit which is connected to the gate region of the field effect transistor based varistor to create an accumulation region there below at normal operating voltages of the semiconductor device to provide a very low series resistance.

Preferably, the input/output pad, the ESD protection device and the circuit to be protected are an integrated circuit on a common substrate.

The biasing circuit has preferably an impedance at the operating frequency, which is higher, preferably much higher, than the impedance of the capacitance of the gate, and comprises advantageously a diode coupled transistor, particularly PMOS transistor, connected to a bias voltage source.

The present invention thus provide for a different type of varistor with larger resistance ratio than the varistors-based prior art device since the ESD protection level is kept unchanged, while the series resistance at normal operating voltages is decreased.

Further characteristics of the invention and advantages thereof will be evident from the detailed description of preferred embodiments of the present invention given hereinafter and the accompanying FIGS. 1–6, which are given by way of illustration only and thus, are not limitative of the present invention.

DESCRIPTION OF PREFERRED EMBODIMENTS

Figure 1:
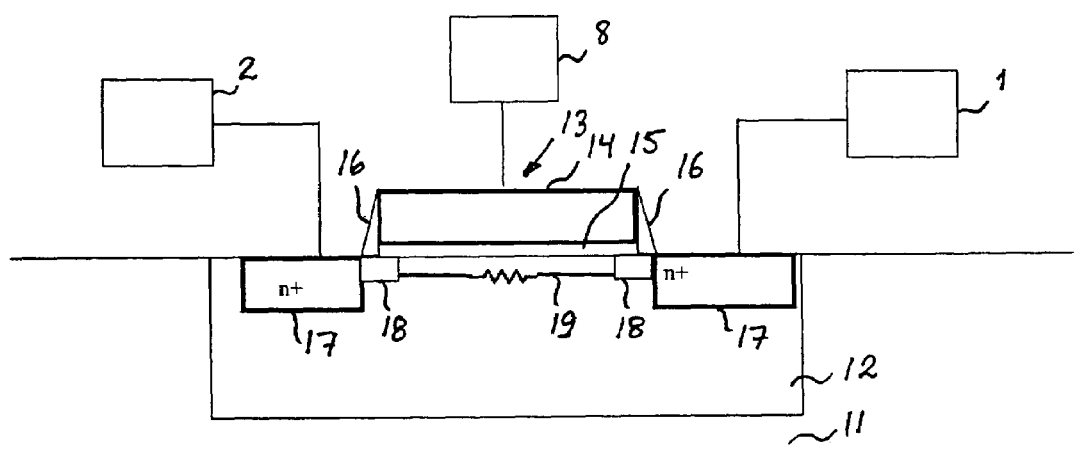
FIG. 1 is a highly enlarged cross-sectional view of a bulk type MOS transistor structure as being used in an ESD protective circuit according to a preferred embodiment of the present invention.

A monolithically integrated ESD protection device according to a preferred embodiment of the present invention is schematically shown in FIG. 1. The device includes a lateral field effect transistor structure, such as a MOS transistor structure, as being illustrated in a highly enlarged cross-sectional view, and a high impedance biasing circuit 8 as being schematically indicated. The MOS transistor structure operates as a varistor for current limitation purposes.

The ESD protection device is interconnected between a schematically illustrated input/output terminal of a high frequency or radio frequency MOS circuit 1, e.g. a receiver or driver circuit, and a likewise schematically illustrated input/output bonding pad 2. The semiconductor device comprising the MOS circuit 1, the ESD protection device, and the bonding pad 2 is in this embodiment preferably an integrated bulk substrate based device.

The lateral MOS transistor based varistor structure is formed in a p-type doped substrate 11 and comprises an n-type doped well region 12, a gate region 13 including a silicon gate layer region 14 and a gate oxide layer region 15 arranged on top of the n-type doped well region 12. An electrically insulating sidewall spacer 16 is formed on each side of the gate region 13 to avoid short-circuiting of the structure. Heavily $n^+$-type doped source and drain regions 17 are formed in the n-type doped well region 12 at a respective side of the gate region 13. One of the drain and source regions 17 is connected to the input/output bonding pad 2, and the other one of the drain and source regions 17 is connected to the input/output terminal of the MOS circuit 1.

Further, the MOS transistor structure may include one or two lightly doped drain (LDD) and/or pocket regions 18 as are commonly formed for MOS transistors. The resistance path between the drain and source regions 17 is schematically indicated by reference numeral 19 in FIG. 1.

The lateral MOS transistor structure based varistor of FIG. 1 can be formed similarly as an NMOS transistor, but wherein the p-type doped well region is exchanged for the n-type doped well region.

The high impedance biasing circuit 8 is connected to the silicon gate layer region 14 and should have an impedance at the operating frequency, which is higher or much higher than the impedance of the capacitance associated with the gate oxide layer region 15, thus reducing the parasitic load on the input/output of the MOS circuit 1. An implementation of a high impedance biasing circuit for use in the present invention will be described below with reference to FIG. 6.

The varistor of FIG. 1 is provided to increase the resistance between the drain and source regions 17 at high voltages, e.g. at a voltage higher than normal operating voltages of the semiconductor device, to thereby limit a potentially damaging current from the input/output bonding pad 2 to the input/output of the circuit 1, or a similar current in an opposite direction. This is obtained in a similar manner as is disclosed in WO 03/021737, the content of which being hereby incorporated by reference.

It shall be noted that the ESD protection is mainly intended to be present during handling of the semiconductor device, i.e. when it is not connected to electrical power. Nevertheless, a current limitation operation is also present when the gate layer region 14 is biased.

At normal operating voltages of the semiconductor device, an accumulation region is created below the gate region by means of the biasing of the gate layer region 14 of the field effect transistor structure, thus decreasing actively the varistor series resistance.

Figure 2:
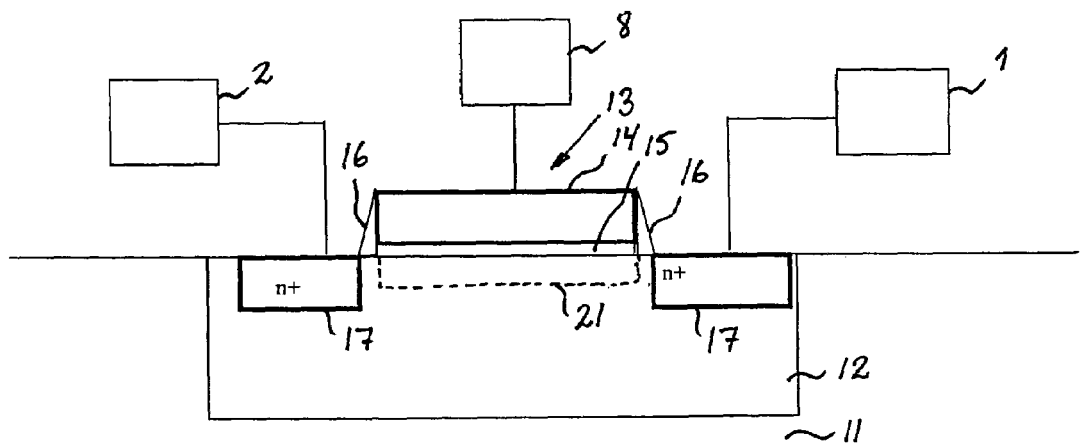
FIGS. 2–3 are highly enlarged cross-sectional views of a bulk type MOS transistor structure in accumulation and unbiased modes, respectively, as being used in an ESD protective circuit according to another preferred embodiment of the present invention.
Figure 3:
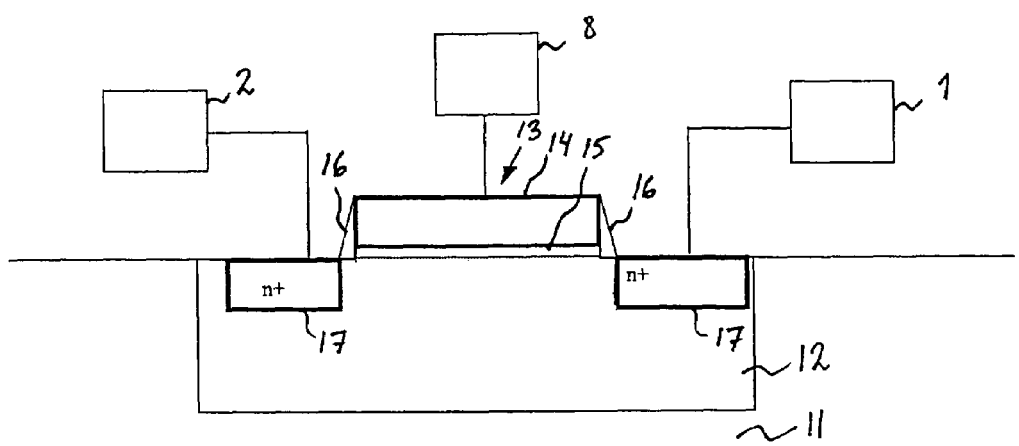

In FIGS. 2–3 a monolithically integrated ESD protection device according to a further preferred embodiment of the present invention is schematically shown. The device includes a bulk type MOS transistor structure, which is illustrated in accumulation (FIG. 2) and unbiased (FIG. 3) modes.

This embodiment is identical with the embodiment of FIG. 1 except for that it lacks the lightly doped drain (LDD)

and pocket regions 18. If the LDD and/or pocket implantation is used in the process, a mask blocking the implantation locally over the varistor of FIGS. 2–3 should be used. The series resistance as obtained by this embodiment would be even lower than the one obtained by the embodiment of FIG. 1.

In application, when the circuit is powered, the gate potential supplied by the biasing circuit 8 will create an accumulation layer 21 under the gate region 13 as can bee seen in FIG. 2. This accumulation layer 21 has a resistance much lower than that of the n-type doped well region 12, and will effectively short circuit the well region resistance leading to several times lower total series resistance of the ESD circuit than in the case without gate bias.

When the voltage gradient between the drain and source regions 17 becomes high due to an ESD event the series resistance is heavily increased.

Thus, the parasitic series resistance of the ESD circuit will achieve acceptable low values during the circuit operation and still give sufficient ESD protection during circuit handling.

Figure 4:
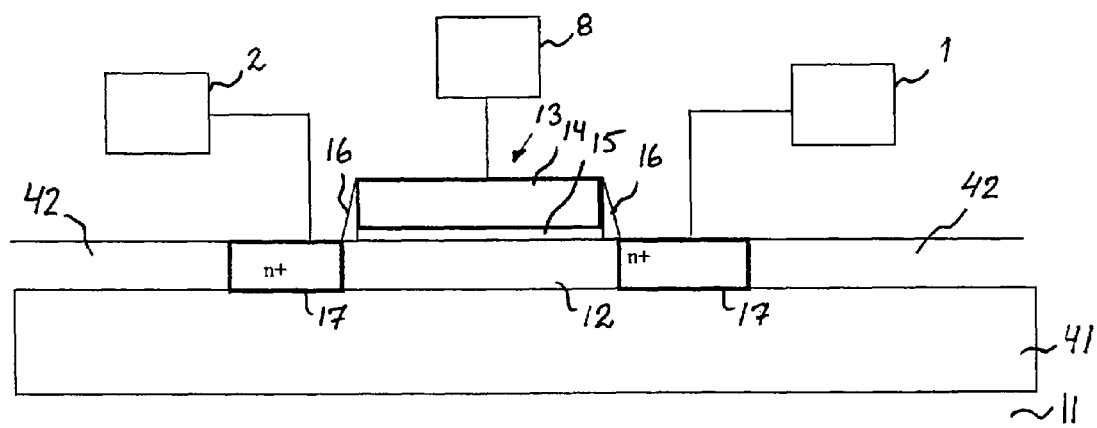
FIG. 4 is a highly enlarged cross-sectional view of a SOI type MOS transistor structure as being used in an ESD protective circuit according to yet a preferred embodiment of the present invention.

With reference next to FIG. 4 yet a further preferred embodiment of the ESD protection device of the present invention comprises a SOI (silicon-on-insulator) type MOS transistor structure based varistor. The varistor comprises here an insulating layer 41 on top of the substrate 11. The n-type doped well region 12, the heavily $n^+$-type doped source and drain regions 17 are formed out of a silicon layer deposited on top of the insulating layer 41. Shallow trench isolation regions 41 are formed on top of the insulating layer 41 outside the source and drain regions 17. In other respects this embodiment does not deviate from the embodiment of FIGS. 2–3.

In this varistor approach used for SOI wafers, the accumulation layer formed will give large opportunities to decrease the parasitic series resistance even further.

Figure 5:
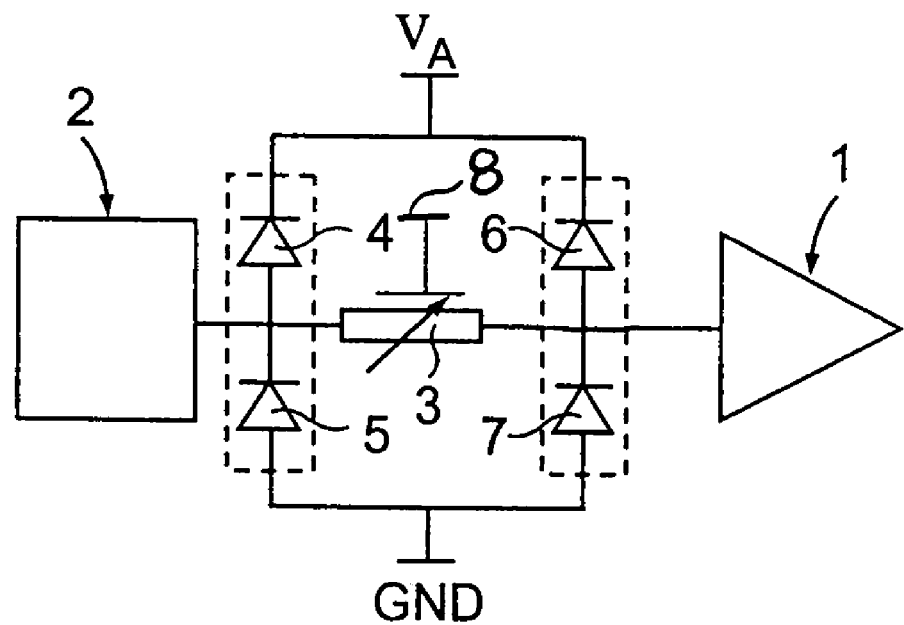
FIG. 5 is a circuit schematic of an ESD protective circuit according to still a preferred embodiment of the present invention.

FIG. 5 is a circuit schematic of an ESD protective circuit according to still a preferred embodiment of the present invention. The circuit comprises a varistor 3 provided with the biasing circuit 8, which varistor 3 may be any of the above-described varistors, a first current shunting device 4, 5 arranged between the input/output bonding pad 2 of the semiconductor device and one of the source and drain regions (16), and a second current shunting device 6, 7 arranged between the other one of the source and drain regions 16 and the input/output of the circuit 1.

The first shunting device, being a primary shunting device, comprises a diode 4 that is connected with its anode to the interconnection point between the varistor 3 and the input/output bonding pad 2 and with its cathode to a positive voltage $V_A$, and a diode 5 that is connected with its cathode to the interconnection point between the varistor 3 and the input/output bonding pad 2 and with its anode to ground GND. The second shunting device, being a secondary shunting device, comprises a diode 6 that is connected with its anode to the interconnection point between the varistor 3 and the input/output of the circuit 1 and with its cathode to a positive voltage $V_A$, and a diode 7 that is connected with its cathode to the interconnection point between the varistor 3 and the input/output of the circuit 1 and with its anode to ground GND.

In case of bulk substrate the diodes 5 and 7 may be an integral part of the varistor, i.e. substrate diodes on the input and the output of the varistor. The diodes 4 and 6 have to be arranged separately. In case of SOI substrate all the diodes 4–7 have to be arranged separately.

In the case the CMOS/BiCMOS technology offers transistors with different gate oxide thickness, the thicker oxide may be used for the varistor of the present invention to decrease the risk of the varistor gate oxide being damaged during an ESD event.

Figure 6:
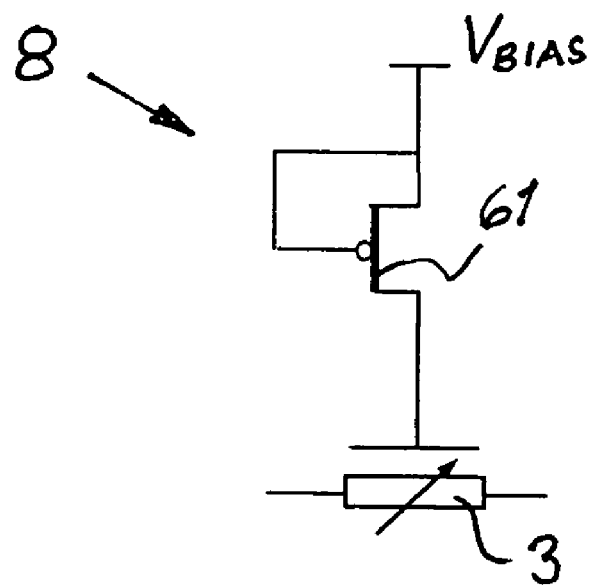
FIG. 6 is a circuit schematic of a bias circuit and a varistor as used in the ESD protective circuit of FIG. 5.

Finally, FIG. 6 is a circuit schematic of an implementation of a bias circuit to be used with any of the varistors of the present invention. The varistor is indicated by 3 in the Figure. A high impedance biasing circuit 8 comprises a diode coupled PMOS transistor 61 connected to a bias voltage source $V_{BIAS}$.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A device for ESD (electrostatic discharge) protection of a circuit of a semiconductor device including a field effect transistor based varistor with gate, source and drain regions, a first one of said source and drain regions being connected to an input/output pad of said semiconductor device, and the second one of said source and drain regions being connected to an input/output terminal of said circuit, the device for ESD protection comprising:

a biasing circuit connected to the gate region of said field effect transistor based varistor to create an accumulation region below the gate region of the field effect transistor based varistor at normal operating voltages of said semiconductor device.

2. The device for ESD protection of claim 1, wherein said circuit, said input/output pad, said field effect transistor based varistor, and said biasing circuit are integrated on a single substrate.

3. The device for ESD protection of claim 1, wherein said biasing circuit has a first impedance at an operating frequency, said gate region has a capacitance having a second impedance at said operating frequency, and the first impedance is higher than the second impedance.

4. The device for ESD protection of claim 1, wherein said biasing circuit includes a diode coupled transistor and a bias voltage source connected to the diode coupled transistor.

5. The device for ESD protection of claim 1, wherein said circuit includes at least one of a HF (high frequency) circuit and an RF (radio frequency) circuit.

6. The device for ESD protection of claim 1, wherein said semiconductor device is a bulk substrate device.

7. The device for ESD protection of claim 1, wherein said semiconductor device is an SOI (silicon-on-insulator) substrate based device.

8. The device for ESD protection of claim 1, further comprising a first current shunting device between the input/output pad of said semiconductor device and the first one of said source and drain regions.

9. The device for ESD protection of claim 1, further comprising a second current shunting device arranged between the second one of said source and drain regions and said circuit.

10. A method for reducing the resistance of a device for ESD (electrostatic discharge) protection of a circuit of a semiconductor device including a field effect transistor based varistor with gate, source and drain regions, the method comprising the steps of:

connecting a first one of said source and drain regions to an input/output pad of said semiconductor device;

connecting the second one of said source and drain regions to an input/output terminal of said circuit; and biasing the gate region of said field effect transistor based varistor to create an accumulation region below the gate region of the field effect transistor based varistor at normal operating voltages of said semiconductor device to thereby reduce a series resistance between the input/output pad of said semiconductor device and the input/output terminal of said circuit.

11. The method of claim 10, further comprising the step of:

shunting current away from at least one of the input/output pad and the input/output terminal.

12. An apparatus, comprising:

an integrated circuit;

an input/output pad; and an electrostatic discharge protection device operably interposed between the integrated circuit and the input/output pad;

wherein the electrostatic discharge protection device is operable in an unpowered state providing a first series resistance between the input/output pad and the integrated circuit, the electrostatic discharge protection device is further operable in a powered quiescent state providing a second series resistance between the input/output pad and the integrated circuit, the electrostatic discharge protection device is further operable in a powered protective state providing a third series resistance between the input/output pad and the integrated circuit, the second resistance being lower that the first resistance, and the third resistance being greater than the first resistance.

13. The apparatus of claim 12, wherein the electrostatic discharge protection device includes a field effect transistor based varistor and a biasing circuit operably coupled to the field effect transistor based varistor, the field effect transistor based varistor and the biasing circuit being co-operable to provide at least the second series resistance.

14. The apparatus of claim 13, wherein the field effect transistor based varistor includes a gate region and the field effect transistor based varistor and the biasing circuit are co-operable to provide the second series resistance by creating an accumulation region below the gate region of the field effect transistor based varistor.

15. The apparatus of claim 14, wherein the field effect transistor based varistor further includes a source region, field effect transistor based varistor further includes a drain region, a first one of the source and drain regions is connected to the input/output pad, and a second one of the source and drain regions is connected to the integrated circuit.

16. The apparatus of claim 15, wherein the integrated circuit, the input/output pad, and the electrostatic discharge protection device are integrated on a bulk substrate.

17. The apparatus of claim 15, wherein the biasing circuit includes a diode coupled transistor.

18. The apparatus of claim 17, wherein the biasing circuit further includes a bias voltage source connected to the diode coupled transistor.

19. The apparatus of claim 18, wherein the diode coupled transistor includes a PMOS transistor.

20. The device for ESD protection of claim 4, wherein the diode coupled transistor includes a PMOS transistor.

* * * * *